United States Patent
Gaal

[19]

[11] Patent Number: 5,930,653
[45] Date of Patent: Jul. 27, 1999

[54] METHOD OF MANUFACTURING A SEMICONDUCTOR DEVICE FOR SURFACE MOUNTING SUITABLE FOR COMPARATIVELY HIGH VOLTAGES, AND SUCH A SEMICONDUCTOR DEVICE

[75] Inventor: Reinder Gaal, Stadskanaal, Netherlands

[73] Assignee: U.S. Philips Corporation, New York, N.Y.

[21] Appl. No.: 08/762,515

[22] Filed: Dec. 10, 1996

[30] Foreign Application Priority Data

Dec. 14, 1995 [EP] European Pat. Off. ............... 95203488

[51] Int. Cl.[6] .................................................. H01L 29/04
[52] U.S. Cl. .......................... 438/462; 438/113; 438/458; 438/958; 257/623
[58] Field of Search .................................. 438/113, 458, 438/462, 958; 257/623

[56] References Cited

U.S. PATENT DOCUMENTS

| | | | |
|---|---|---|---|
| 4,041,523 | 8/1977 | Vogt | 357/72 |
| 4,197,631 | 4/1980 | Meyer et al. | 29/574 |
| 5,393,711 | 2/1995 | Biallas et al. | 437/231 |
| 5,482,887 | 1/1996 | Duinkerken et al. | 437/226 |
| 5,661,091 | 8/1997 | Duinkerken et al. | 438/458 |

FOREIGN PATENT DOCUMENTS

| | | | |
|---|---|---|---|
| 0603971 A2 | 6/1994 | European Pat. Off. | H01L 21/78 |
| 2930460C2 | 7/1986 | Germany . | |

OTHER PUBLICATIONS

Tummala et al., Microelectronics Packaging Handbook, Van Nostand–Reinhold Press, pp. 578–582, 1989.

*Primary Examiner*—Donald L. Monin, Jr.
*Assistant Examiner*—Michael Dietrich

[57] ABSTRACT

The invention relates to a method of manufacturing a semiconductor device whereby an upper side of a wafer of semiconductor material (12) is provided with semiconductor elements in passivated mesa structures (2), which semiconductor elements are provided each with a connection electrode (7') in that according to the invention conductive contact bodies (3') are provided on upper sides (7) of the mesa structures (2), and an insulating material (18) is provided in spaces (17) between the contact bodies, whereupon the wafer (1) is split up into individual semiconductor bodies (10) which comprise passivated mesa structures (2) and contact bodies (3') surrounded by insulation. The contact bodies (3') have dimensions such that the semiconductor bodies (10) are suitable for surface mounting. The semiconductor devices made by the method according to the invention are resistant to comparatively high voltages between the connection electrodes (7', 4). The method has the additional advantage that the semiconductor device can be readily manufactured in certain standard dimensions such as exist for SMDs through adaptation of the dimensions of the contact body (3').

6 Claims, 4 Drawing Sheets

METHOD OF MANUFACTURING A SEMICONDUCTOR DEVICE FOR SURFACE MOUNTING SUITABLE FOR COMPARATIVELY HIGH VOLTAGES, AND SUCH A SEMICONDUCTOR DEVICE

BACKGROUND OF THE INVENTION

The invention relates to a method of manufacturing a semiconductor device whereby an upper side of a wafer of semiconductor material is provided with semiconductor elements in passivated mesa structures, which semiconductor elements are provided with connection electrodes which are provided on upper sides of the mesa structures and on a lower side of the wafer, whereupon the wafer is split up into individual semiconductor bodies which comprise mesa structures with first connection electrodes connected to lower sides of the semiconductor bodies and with second connection electrodes connected to upper sides of the mesa structures.

A mesa structure is understood to be a plateau surrounded by a groove or recess. The groove or recess is provided with a passivating layer so that a passivated mesa structure is created.

DESCRIPTION OF THE RELATED ART

German Patent no. 2930460 discloses a method of the kind mentioned in the opening paragraph whereby a diode is manufactured. The connection electrodes of the diode are provided in that metal layers are provided and subsequently patterned. The metal layers are provided on main surfaces of the wafer, i.e. on an upper and a lower side of the wafer. The metal layer is patterned on the upper side by means of photolithography and etching such that only the plateaus of the mesa structures are covered by the metal layer. The wafer is subsequently split up by sawing into individual semiconductor bodies, each comprising a mesa structure. The connection electrodes on the lower side of the wafer are patterned by means of the splitting-up process. The semiconductor bodies are then each built in in a suitable housing, whereby semiconductor devices are created.

The passivated mesa structure renders it possible in practice to use the semiconductor bodies manufactured by the known method directly as surface mounted devices (SMD). The semiconductor bodies manufactured by the known method are not built in into fitting housings in that case but are directly mounted on a printed circuit board or something similar as semiconductor devices. Although such semiconductor devices perform satisfactorily in general, it is found that semiconductor bodies used in this manner give rise to problems when they are operated at comparatively high voltages. In addition, the semiconductor devices do not have standard dimensions such as are usual for SMDs.

SUMMARY OF THE INVENTION

The invention has for its object inter alia to provide a method of manufacturing a semiconductor device which yields semiconductor devices which can withstand comparatively high voltages.

According to the invention, the method is for this purpose characterized in that the second connection electrodes are provided on the mesa structures in that conductive contact bodies are provided on upper sides of the mesa structures and an insulating material is provided in spaces between said contact bodies, upper sides of the contact bodies not being covered with the insulated material, whereupon the wafer with the contact bodies and the insulating material is split up into individual semiconductor bodies comprising passivated mesa structures and contact bodies surrounded by insulation, with the upper sides of the contact bodies serving as second connection electrodes, while the contact bodies have dimensions such that the semiconductor bodies are suitable for surface mounting.

Contact bodies surrounded by insulation are thus provided on the upper sides, i.e. on the plateaus of the mesa structures according to the invention. A connection surface of the upper connection electrode is thus as it were transferred from an upper side of the mesa structure to an upper side of a contact body. The space between the contact bodies is filled up so that the insulating layer around the contact bodies merges into the passivating layer on the sides of the mesa structures. A continuous insulating layer is created thereby, passivating the mesa structure and insulating the contact body.

It is achieved thereby that semiconductor devices resistant to comparatively high voltages between the connection electrodes are made by the method.

The invention is based on the recognition that semiconductor devices manufactured by the method according to the invention have a comparatively great distance between the connection electrodes. A great distance between the electrodes increases the creepage path which charge must travel to cause electric breakdown between the electrodes. The semiconductor device is well passivated by the passivated mesa structure and the insulated contact body, so that the semiconductor body with the contact body can be used as an SMD without final mounting in an envelope. The method has the additional advantage that the semiconductor device can be readily manufactured in certain standard dimensions such as exist for SMDs. Such standard dimensions, for example 0805 (0.8 inch×0.5 inch×0.5 inch) or 0603 (0.6 inch×0.3 inch×0.3 inch), can be manufactured in that the dimensions of the contact body are adapted.

Preferably, contact bodies are provided such that a distance between upper sides of the mesa structures and upper sides of the contact bodies is more than 1 mm. In other words, contact bodies with a length of more than 1 mm are provided. The distance between the connection electrodes is then increased by more than 1 mm compared with a semiconductor device manufactured by the known method, so that the semiconductor device performs well at comparatively high voltages of more than 300 V between the connection electrodes.

The space between the contact bodies may be filled, for example, in that a resin is poured between the contact bodies and this resin is cured. Contact bodies surrounded by the resin are then formed when the wafer is split up into individual semiconductor devices. An additional advantage is obtained when an insulating material is provided through placement of the wafer with contact bodies in a mould cavity, the upper sides of the contact bodies and the lower sides of the wafer lying against walls of the mould cavity, and the mould cavity is filled with resin. The upper sides of the contact bodies remain free from resin because they lie against a wall of the mould cavity. The resin may thus be provided in a simple manner with high accuracy. This method is highly suitable especially for mass manufacture. Such a technique is a standard technique used for enveloping semiconductor elements, so that the technology is available.

It is noted that this technique of filling the spaces between the contact bodies differs from the encapsulation of semiconductor bodies in suitable housings. In the latter case, the connection electrodes of the semiconductor bodies are connected to lead frames via bonding wires. The lead frames with the semiconductor bodies are entirely enveloped in the resin only after that. The method according to the invention has the advantage that the high-frequency properties of semiconductor devices manufactured by the method are much better than those of conventional semiconductor devices, because no bonding wires are used.

An additional advantage is obtained when the mould cavity comprises aids which fix the contact bodies in position during filling. Aids such as projections or recesses are used in this case for fixing the contact bodies. The wafer with contact bodies provided with resin is then fixed in such a manner that warping of the wafer and deformation of the contact bodies is prevented.

It may happen with contact bodies of slightly unequal lengths that a contact body does not lie against the wall of the mould cavity. In such a situation the resin may cover the upper side of the contact body and hamper an electrical connection to said contact body. In an alternative advantageous embodiment of the method, an insulating material is provided through the introduction of a deformable insulating material into the spaces between the mesa structures and through the provision of an insulating jig with recesses for the contact bodies in the spaces between the mesa structures, the contact bodies entering the recesses and part of the deformable insulating material being pressed into the recesses between the contact bodies and the mould, whereupon the deformable insulating material is cured and the wafer and the insulating material are split up into individual semiconductor bodies. It is comparatively easy in such an embodiment to keep the upper sides of the contact bodies free from the deformable insulating material because the quantity of deformable insulating material pressed into the recesses can be controlled via the shape of the jig. The insulating material of the jig and the cured deformable insulating material are split up in the splitting-up process.

Preferably, the insulating layer is provided with grooves between the contact bodies, while the wafer and the insulating material are split up through wire sawing, the grooves in the insulating material being used as guides for a wire saw. Such a method has the advantage that the semiconductor devices can be manufactured with high dimensional accuracy.

The invention also relates to a semiconductor device with a semiconductor body comprising a semiconductor substrate with a passivated mesa structure provided with a semiconductor element with a connection electrode on an upper side of the mesa structure and a connection electrode on the semiconductor substrate.

According to the invention, the connection electrode on the mesa structure comprises a conductive contact body which is surrounded by an insulating material such that the semiconductor body is suitable for use as a surface mounted device. An upper side of the contact body serves as a connection point for the connection electrode on the mesa structure.

Such a semiconductor device can withstand comparatively high voltages between the connection electrodes. Furthermore, the semiconductor device is well passivated by the passivated mesa structure and the insulated contact body, so that the semiconductor body with the contact body can be used as an SMD without final mounting in an envelope. The semiconductor body may be readily manufactured in certain standard dimensions which exist for SMDs in that the dimensions of the contact body are adapted.

Preferably, a contact body is provided such that a distance between an upper side of the mesa structure and an upper side of the contact body is more than 1 mm. Such a semiconductor device is resistant to a voltage of more than 300 V between the connection electrodes.

BRIEF DESCRIPTION OF THE DRAWINGS

The invention will be explained in more detail below by way of example with reference to embodiments and the accompanying diagrammatic drawing, in which.

The Figures are purely diagrammatic and not true to scale. Corresponding parts have generally been given the same reference numerals in the Figures.

DETAILED DESCRIPTION OF THE INVENTION

Figure 1:
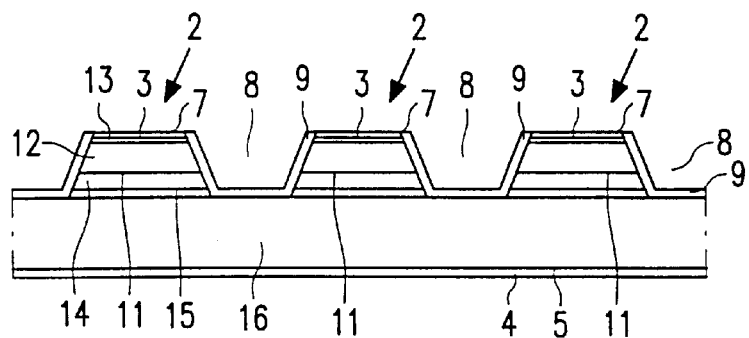
FIG. 1 is a cross-section of a wafer of semiconductor material provided with semiconductor elements in passivated mesa structures.
Figure 2:
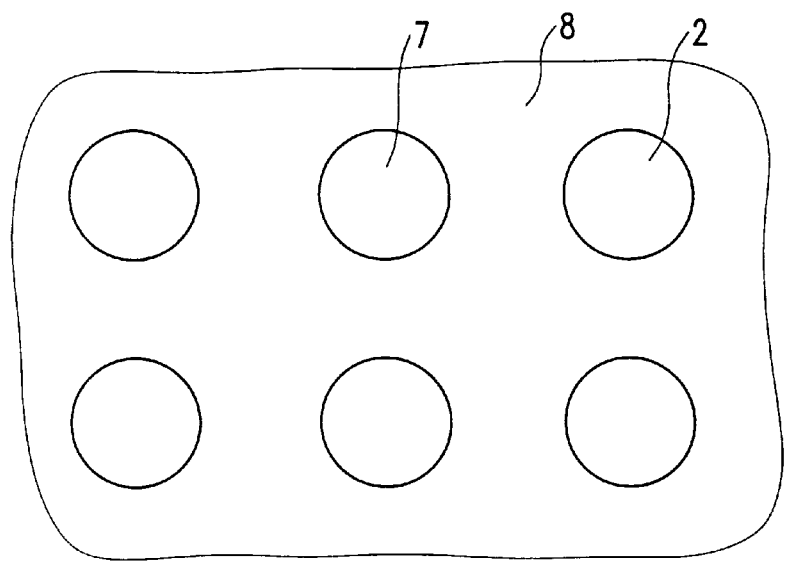
FIG. 2 is a plan view of a wafer of semiconductor material provided with semiconductor elements in passivated mesa structures.

FIGS. 1 to 6 show stages in a first embodiment of a method of manufacturing a semiconductor device whereby an upper side of a wafer 12 of semiconductor material is provided with semiconductor elements in passivated mesa structures 2, said semiconductor elements being provided with connection electrodes in that electrodes are provided on the mesa structures 2 and on a lower side 5 of the wafer, whereupon the wafer 12 is split up into individual semiconductor bodies 10 each comprising a mesa structure 2. FIGS. 1 and 2 show that the passivated mesa structure 2 comprises an upper side or plateau 7 surrounded by a groove or recess 8. The groove or recess 8 is provided with a passivating layer 9. FIGS. 1 and 2 show how a wafer 12 of semiconductor material is provided with diodes in mesa structures 2 in a manner analogous to a method as described in German Patent no. 2930460. A pn junction 11 is provided here parallel to a main surface of the wafer 12. For this purpose, an n-type wafer of silicon 12 is provided with an $n^+$-type layer 13 and a $p^+$-type layer 14. A pn junction 11 is thus created between the layer 14 and the silicon wafer 12. The wafer 12 is then connected to a $p^{++}$-type silicon support wafer 16 by means of a 10 $\mu$m thick aluminium layer 15 so as to make it stronger for processing. Subsequently, grooves 8 continuing into the support wafer 16 are provided in an upper side of the wafer 12. Walls of the grooves 8 are given a glass layer 9. Standard contact layers of Ti—Ni—Ag 3 and 4 are subsequently provided on an upper side 7 and a lower side 5, respectively, of the wafer 1. The Ti—Ni—Ag layer 3 is patterned at the upper side by a standard lithographic technique, so that the connection electrodes 3 will be present on the plateaus 7 of the mesa structures 2 only.

Figure 3:
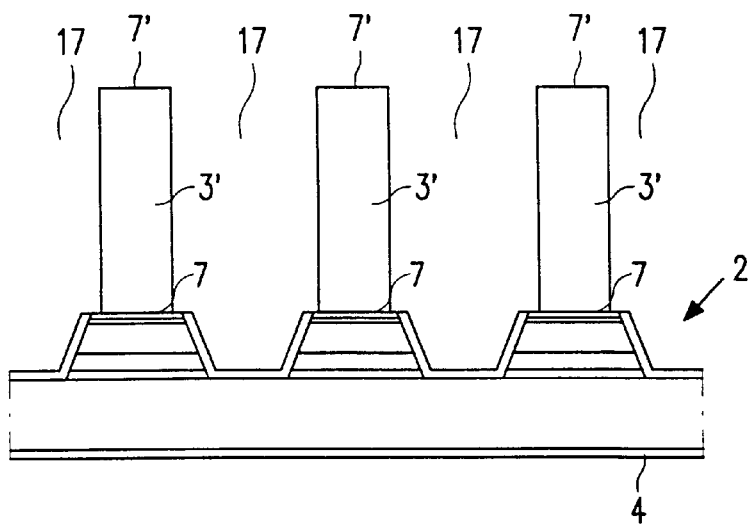
FIGS. 3 to 6 are cross-sections showing various stages in the manufacture of a semiconductor body according to a first embodiment of the invention.
Figure 4:
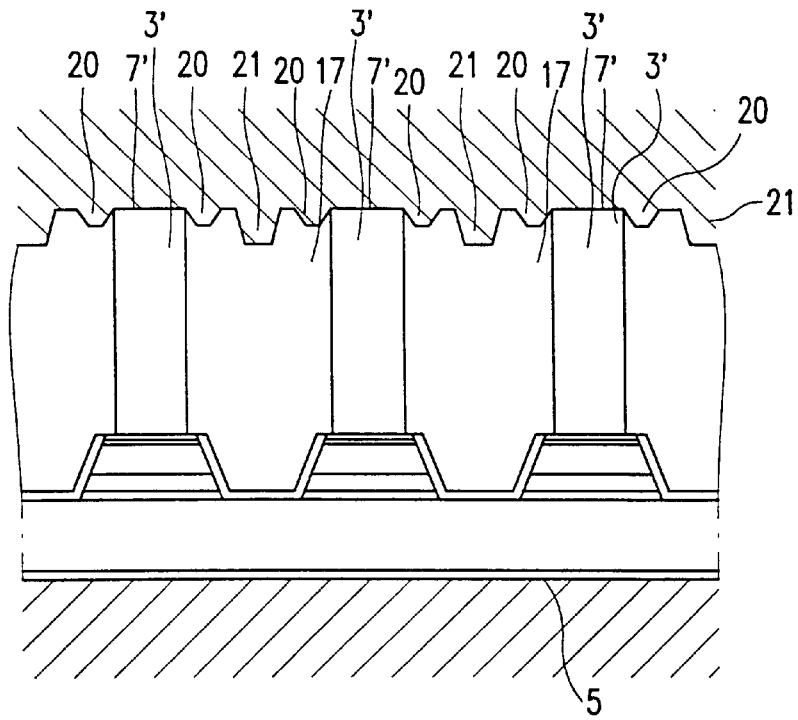
Figure 5:
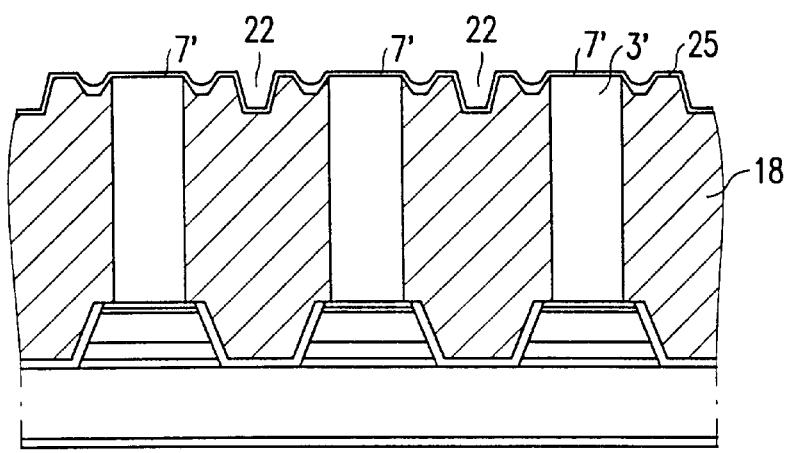

FIG. 3 shows how according to the invention electrodes are provided on the mesa structures 2 in that conductive contact bodies 3' are provided on the upper sides 7 of the mesa structures 2. The contact bodies 3' in this example comprise cylindrical copper pins which are soldered each with a surface which is perpendicular to the cylinder on the Ti—Ni—Ag layer. Preferably, contact bodies 3' are provided such that a distance between upper sides 7 of the mesa structures and upper sides 7' of the contact bodies 3' is more than 1 mm. In other words, contact bodies 3' with a length of more than 1 mm are provided in this example. The contact pins 3' are provided and fixed by means of a graphite jig during soldering of the contact bodies to the Ti—Ni—Ag layer 3. The provision of the pins by means of a jig lends itself very well to automation. FIGS. 4 and 5 show how an insulating material 18 is introduced into spaces 17 between the contact bodies 3'. In this example, an insulating material 18 is provided in that the wafer 1 with contact bodies 3' is placed in a mould cavity, the upper sides 7' of the contact bodies 3' and the lower side 5 of the wafer 1 lying against walls of said mould cavity, whereupon the mould cavity is filled with resin 18. The upper sides 7' of the contact bodies 3' remain free from resin 18 because they lie against a wall of the mould cavity. The resin 18 can thus be provided in a simple manner with high accuracy by such a method. A standard epoxy material is used as the resin 18. Such materials are known for enveloping electronic components. This method is highly suitable particularly for mass manufacture. Such a technique is used as a standard technique in enveloping semiconductor elements, so that the technology is available. FIG. 4 shows that the mould cavity comprises aids 20 which fix the contact bodies 3' in place during filling. In this example, the aids 20 are projections on the mould wall. The wafer 1 with contact bodies 3' is then so fixed that warping of the wafer 1 and deformation of the contact bodies 3' are prevented during moulding. After the insulating material 18 has been provided, a conductive layer 25 is provided on the upper side 7' of the contact bodies 3' and of the insulating material so as to facilitate a better contacting of the contact bodies (see FIG. 5). The conductive layer 25 comprises a standard solder layer of, for example, Ag, Ni—Ag, Ti—Ni—Ag, or Pb—Sn.

FIG. 4 shows how the mould also comprises projections 21 such that the insulating material 18 is provided with grooves 22 between the contact bodies 3' (see also FIG. 5). The wafer 1 and the insulating material 18 are subsequently split up by wire sawing, the grooves 22 in the insulating material 18 acting as guides for the wire saw. Such a method has the advantage that the semiconductor devices 10 can be manufactured with high dimensional accuracy.

Figure 6:
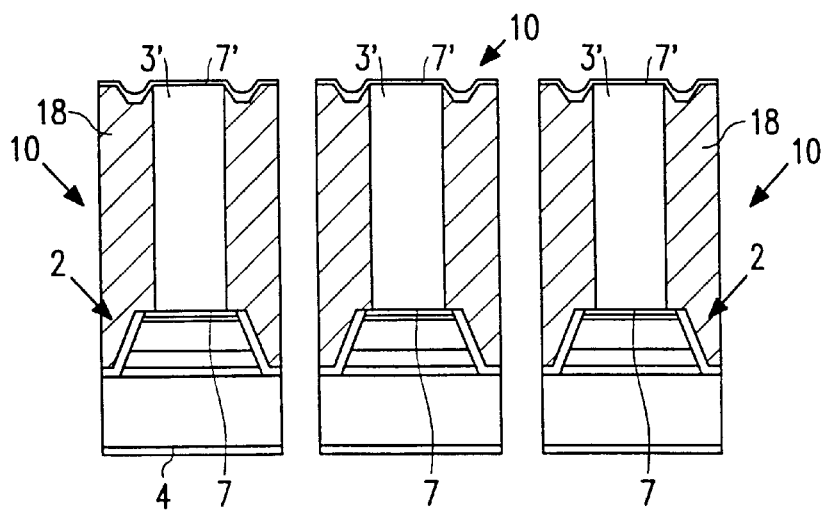
Figure 7:
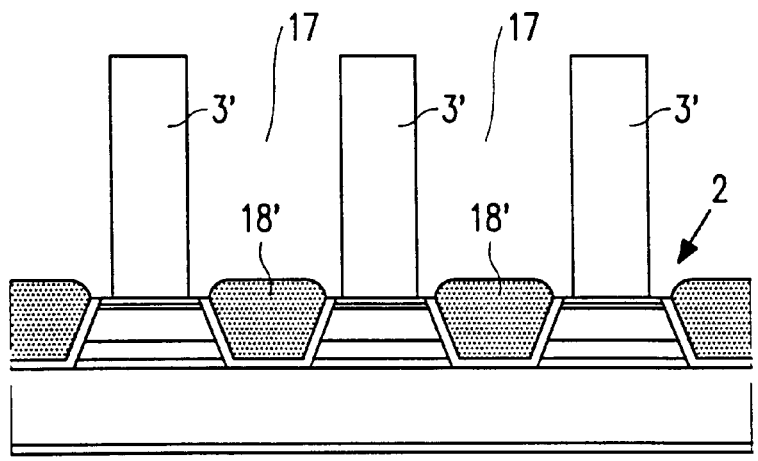
FIGS. 7 to 10 show various stages in the manufacture of a semiconductor device according to a second embodiment of the invention.

FIG. 6 shows how the contact bodies 3' are provided all round with an insulating layer 18 after splitting-up of the wafer 1. The semiconductor bodies are then ready for use as semiconductor devices of the surface mounted type (SMD). An upper side 7' of each contact body 3' is not insulated and acts as a connection electrode for rendering possible the connection of the electrode to, for example, conductors on a printed circuit board when the semiconductor device is mounted on such a board. In the present example, a support wafer 16 and a semiconductor wafer 12 of 300 μm thickness are used. The length of the contact pin is 1.4 mm. The semiconductor device then has the dimensions 2×1.25×1.25 mm. These dimensions are the prescribed dimensions for a so-called 0805 SMD envelope. Other standard dimensions may readily be manufactured in that the dimensions of the contact body 3' are adjusted.

The semiconductor device made by this embodiment of the method performs satisfactorily at comparatively high voltages of more than 500 V across the connection electrodes 7', 4.

Figure 8:
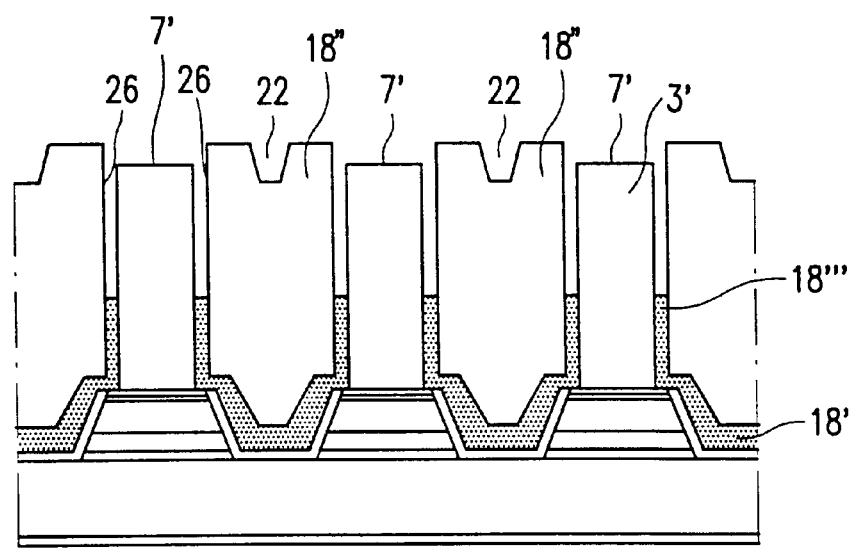
Figure 9:
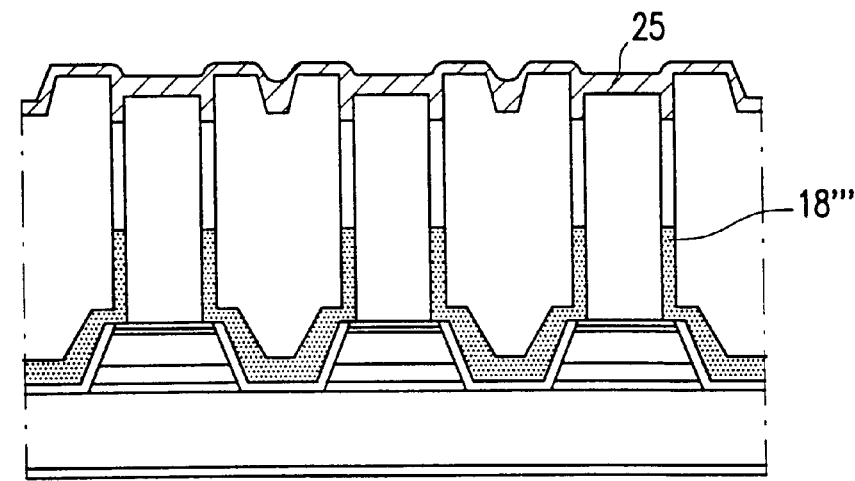

FIGS. 7 to 10 show an alternative method according to the invention. In this embodiment, a structure is again first made which is analogous to the structure pictured in FIGS. 1 and 2 and described for the previous embodiment, an upper side of a wafer 12 of semiconductor material being provided with semiconductor elements in passivated mesa structures 2. In this second embodiment of the method, an insulating material 18 is provided, see FIG. 7, in that a deformable insulating material 18', in this example a curable epoxy synthetic resin known per se, is provided in the spaces 17 between the contact bodies 3'. FIG. 8 further shows how an insulating jig 18" of alumina with recesses 26 for the contact bodies 3' is provided. The contact bodies 3' will enter the recesses 26. FIGS. 8 and 9 show how a portion 18''' of the deformable insulating material 18' is pressed into the recesses 26 between the contact bodies 3' and the jig 18" while the jig 18" is being provided. The deformable insulating material 18', 18''' is subsequently cured by a heat treatment of a few minutes at approximately 150° C. The exact curing time depends on the epoxy resin used. In such an embodiment, it is comparatively simple to keep upper sides 7' of the contact bodies 3' free from the deformable insulating material 18', 18''' because the quantity of deformable insulating material 18''' pressed into the recesses 26 can be controlled by means of the quantity of material 18' provided and the shape of the jig 18".

The upper side 7' of the contact bodies and the upper side of the jig 18" are provided with a conductive layer 25 (see FIG. 9) so as to render possible a good electric contact with the semiconductor device. This layer comprises a standard Ti—Ni—Ag contact layer.

FIG. 8 shows how the insulating material of the jig 18" comprises grooves 22 between the contract bodies 3'. The wafer 1 and the jig 18" are subsequently split up by wire sawing, the grooves 22 in the jig serving as guides for the wire saw. Such a method has the advantage that semiconductor devices 10 of high dimensional accuracy can be manufactured.

Figure 10:
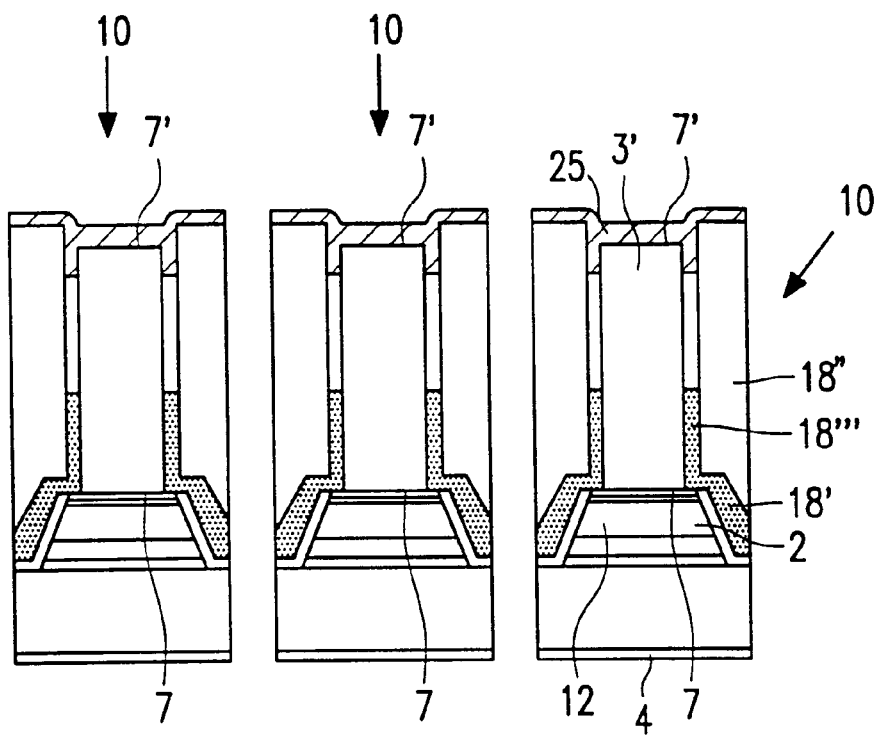

FIGS. 6 and 10 show how a semiconductor device 10 is manufactured by the method according to the invention with a semiconductor body comprising a semiconductor substrate 12 with a passivated mesa structure 2 provided with a semiconductor element with a connection electrode 7' on the mesa structure 2 and a connection electrode 4 on the semiconductor substrate 1.

According to the invention, the connection electrode 7' on the mesa structure 2 comprises a conductive contact body 3' which is surrounded by an insulating material 18, 18', 18", 18''', so that the semiconductor body is suitable for use as a semiconductor device 10 for surface mounting. An upper side.7' of the contact body 3' serves as the connection point for the connection electrode on the mesa structure 2.

Such a semiconductor device is resistant to comparatively high voltages between the connection electrodes. Furthermore, the semiconductor device 10 is well passivated by the passivated mesa structure 2 and by the insulated contact body 3', so that the semiconductor body with the contact body 3' can be used as an SMD without final mounting in an envelope. The semiconductor device 10 may be readily manufactured in certain standard dimensions such as exist for SMDs in that the dimensions of the contact body 3' are adapted.

Preferably, a contact body 3' is provided such that a distance between an upper side 7 of the mesa structure 2 and an upper side 7' of the contact body 3' is more than 1 mm. Such a semiconductor device 10 is resistant to a voltage of more than 300 V between the connection electrodes 7', 4.

The invention is not limited to the embodiments described since many modifications and variations are possible to those skilled in the art within the scope of the invention. Thus the semiconductor wafer may be made from a material other than silicon, for example from germanium or GaAs. A support wafer 16 is used in the examples. Such a support wafer 16 is not essential to the invention, for example if the wafer 12 of semiconductor material is sufficiently thick. The support wafer 16 may alternatively be made from a well conducting metal, while materials other than Ti—Ni—Ag or solder may be used for fastening the contact bodies 3' and for the conductive layer 25. Several pn junctions or passive elements may be present in the mesa structures 2, for example forming transistors and resistors. Several contact bodies may be provided on the upper sides of the mesa structure in that case, depending on the number of connection electrodes. A synthetic resin was used as the insulating material in the examples. It is alternatively possible to use some other insulating material, for example a ceramic material or a glass or an oxidic material. Splitting-up of the wafer and the contact bodies surrounded by the insulating material takes place by wire sawing in the examples. It is also possible to split them up by alternative techniques such as breaking, grinding, or etching. The contact bodies serve to conduct electric current. That is not to say, however, that the contact bodies must necessarily be metallically conductive. It may be desirable under certain circumstances for the contact bodies 3' to have a certain electric resistance, for example in order to limit a current through the semiconductor device. Cylindrical copper contact bodies were used in the examples. The invention is not limited to contact bodies made from such a material and of such a shape. Thus the contact bodies may be made from an alternative conductive metal or an alternative conductive material such as a conductive ceramic material or synthetic resin. The shape of the contact bodies is not critical. Thus angled contact bodies may also be used. The upper side 7' of the contact bodies 3' is given a conductive layer 25 in the examples. A conductive layer 25 is not necessary if the contact bodies in themselves are sufficiently conductive.

I claim:

1. A method of manufacturing a semiconductor device whereby an upper side of a wafer of semiconductor material is provided with semiconductor elements in passivated mesa structures, which semiconductor elements are provided with connection electrodes which are provided on upper sides of the mesa structures and on a lower side of the wafer, whereupon the wafer is split up into individual semiconductor bodies which comprise mesa structures with first connection electrodes connected to lower sides of the semiconductor bodies and with second connection electrodes provided on the upper sides of the mesa structures and conductive contact bodies are provided on upper sides of the mesa structures and electrically interfacing with the second connection electrode, the conductive contact bodies extending from the upper sides of the mesa structure, and an insulating material is provided in spaces between said contact bodies, upper sides of the contact bodies not being covered with the insulated material, whereupon the wafer with the contact bodies and the insulating material is split up into individual semiconductor bodies comprising passivated mesa structures and contact bodies surrounded by insulation, with the upper sides of the contact bodies serving as second connection electrodes, while the contact bodies have dimensions such that the semiconductor bodies are suitable for surface mounting.

2. A method as claimed in claim 1, characterized in that contact bodies are provided such that a distance between upper sides of the mesa structures and upper sides of the contact bodies is more than 1 mm.

3. A method as claimed in claim 1, characterized in that the insulating material is provided through placement of the wafer with contact bodies in a mould cavity, the upper sides of the contact bodies and the lower sides of the wafer lying against walls of the mould cavity, whereupon the mould cavity is filled with resin.

4. A method as claimed in claim 3, characterized in that the mould cavity comprises aids which fix the contact bodies in position during filling.

5. A method as claimed in claim 1, characterized in that the insulating material is provided through the introduction of a deformable insulating material into the spaces between the mesa structures and through the provision of an insulating jig with recesses for the contact bodies in the spaces between the mesa structures, the contact bodies entering the recesses and part of the deformable insulating material being pressed into the recesses between the contact bodies and the jig, whereupon the deformable insulating material is cured and the wafer and the insulating material are split up into individual semiconductor bodies.

6. A method as claimed in claim 1, characterized in that the insulating layer is provided with grooves between the contact bodies and the wafer and the insulating material are split up through wire sawing, the grooves in the insulating material being used as guides for a wire saw.

\* \* \* \* \*